United States Patent [19]
Maeda

[11] Patent Number: 5,650,673
[45] Date of Patent: Jul. 22, 1997

[54] TIMER DEVICE FOR A POWER SOURCE

[75] Inventor: Koji Maeda, Tokyo, Japan

[73] Assignee: NEC Corporation, Tokyo, Japan

[21] Appl. No.: 494,315

[22] Filed: Jun. 23, 1995

[30] Foreign Application Priority Data

Jun. 24, 1994 [JP] Japan .................................. 6-143452

[51] Int. Cl.$^6$ .................................................. H01H 3/34
[52] U.S. Cl. ........................ 307/141.4; 307/140; 307/125
[58] Field of Search ................................ 307/139, 140, 307/141, 141.4, 141.8, 142, 112, 116, 125, 126

[56] References Cited

U.S. PATENT DOCUMENTS 4,104,541  8/1978  Jewell ................................... 307/141
4,376,253  3/1983  Levy et al. ............................ 327/393
4,745,629  5/1988  Essig et al. ........................... 377/20
5,455,469 10/1995  Ward ................................... 307/141.4

FOREIGN PATENT DOCUMENTS 61-7911  1/1986  Japan .

Primary Examiner—William M. Shoop, Jr.
Assistant Examiner—Jonathan Kaplan
Attorney, Agent, or Firm—Young & Thompson

[57] ABSTRACT

A timer device for controlling the ON/OFF of a power source generates a long delay from the time when the power source is turned on to the time when the power source timer function thereof is validated. When the power source is turned off and then turned on at a short interval, the device is initialized and prevents equipment incorporating the device from being used over a long period of time. The device, therefore, obviates the illicit use of the equipment.

4 Claims, 2 Drawing Sheets

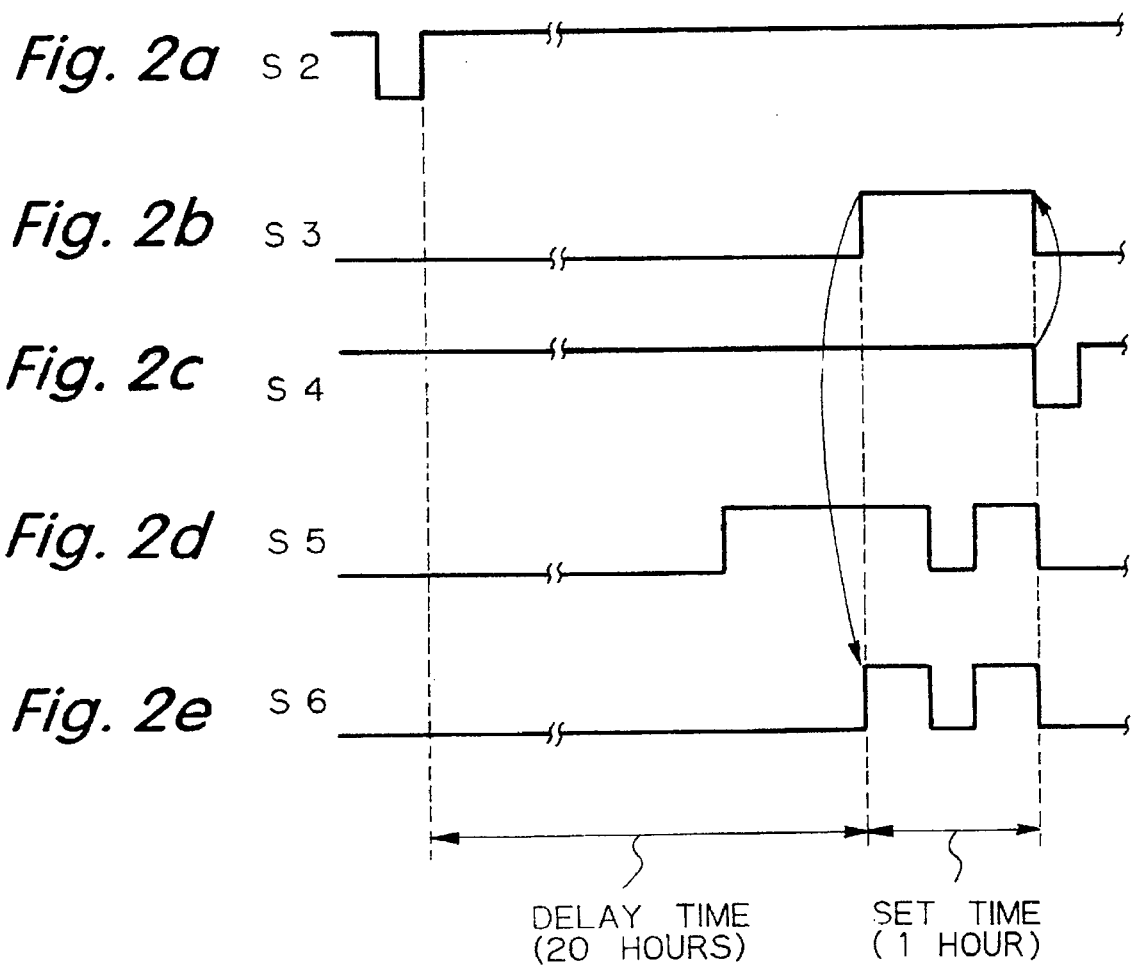

5,650,673

TIMER DEVICE FOR A POWER SOURCE

BACKGROUND OF THE INVENTION

The present invention relates to a timer device for controlling the ON/OFF of a power source and, more particularly, to a timer device which returns to an initial state when a power source is turned off and then turned on at a short interval. In the initial state, the device prevents equipment incorporating it from being used illicitly or against rules for a long period of time.

A timer device for the ON/OFF control of a power sources is extensively used in various ways in the modern society. The timer device allows, for example, a video cassette recorder to be automatically switched on at a designated time for starting on a recording operation. Also, the timer device is capable of switching on equipment only for a designated period of time and then switching it off automatically. This kind of timer device can be readily implemented by the combination of a timepiece circuit and a power source control circuit.

However, the conventional timer device cannot serve the expected function for some applications. For example, assume the timer device built in a television/video set usually installed in a hotel room. With the television/video set, the viewer is usually not charged for ordinary TV programs, but charged for special programs including latest movies. The timer device is used to televise a movie free of charge only for a preselected period of time, thereby allowing the viewer to decide whether to see the movie. The problem is that when the power source of the timer device is turned off, the preselected period of time for free television is initialized. The viewer, therefore, can see the pay movie without being charged by turning on and turning off the power source of the timer device repeatedly.

Japanese Patent Laid-Open Publication No. 61-7911 discloses a timer device capable of preventing a power source from being turned on for a predetermined period of time after it has been turned off. However, this timer device is so arranged as to obviate a rush current when a power source is turned off and then turned on at a short interval. This kind of function is different from the originally expected function stated above.

SUMMARY OF THE INVENTION

It is, therefore, an object of the present invention to provide a power source timer device capable of preventing equipment incorporating it from being used illicitly or against rules.

In accordance with the present invention, a timer device having a timer function for controlling the ON/OFF of a power source has an input terminal for receiving an input voltage from the power source, an output terminal for outputting an output voltage, and a timer circuit for generating a predetermined delay time from the time when the power source is turned on to the time when the timer function is validated. When the power source is turned off and then turned on at a short interval, the timer device is initialized to again set up the predetermined delay time.

Also, in accordance with the present invention, a timer device for a power source has an input terminal for receiving an input voltage, a power source control circuit for controlling the output of the input voltage, an output terminal for outputting a voltage output from the power source control circuit, and a timer circuit having a reference time generating circuit, a delay circuit, a counting circuit, a reset signal generating circuit, and a power switch. The reset signal generating circuit outputs a reset signal by ORing a time over signal to be output from the counting circuit on the elapse of a predetermined delay time, and a power-on reset signal to be output when the power switch is turned on. The delay circuit counts the predetermined delay time on the basis of a timing clock signal output from the reference time generating circuit, initializes the count of the predetermined delay time in response to the reset signal, and feeds a control signal to the counting circuit. The counting circuit receives the timing clock signal, a signal representative of the state of the power switch, and the control signal, and outputs the time over signal to the reset signal generating circuit while outputting a power source output control signal to the power source output control circuit. The power source control circuit controls the output of the voltage on the basis of the power source output control signal, and outputs the result of control on the output terminal.

BRIEF DESCRIPTION OF THE DRAWINGS

The above and other objects, features and advantages of the present invention will become more apparent from the following detailed description taken with the accompanying drawings in which:

FIG. 2A–2E are timing charts demonstrating a specific operation of the embodiment.

DESCRIPTION OF THE PREFERRED EMBODIMENT

Figure 1:
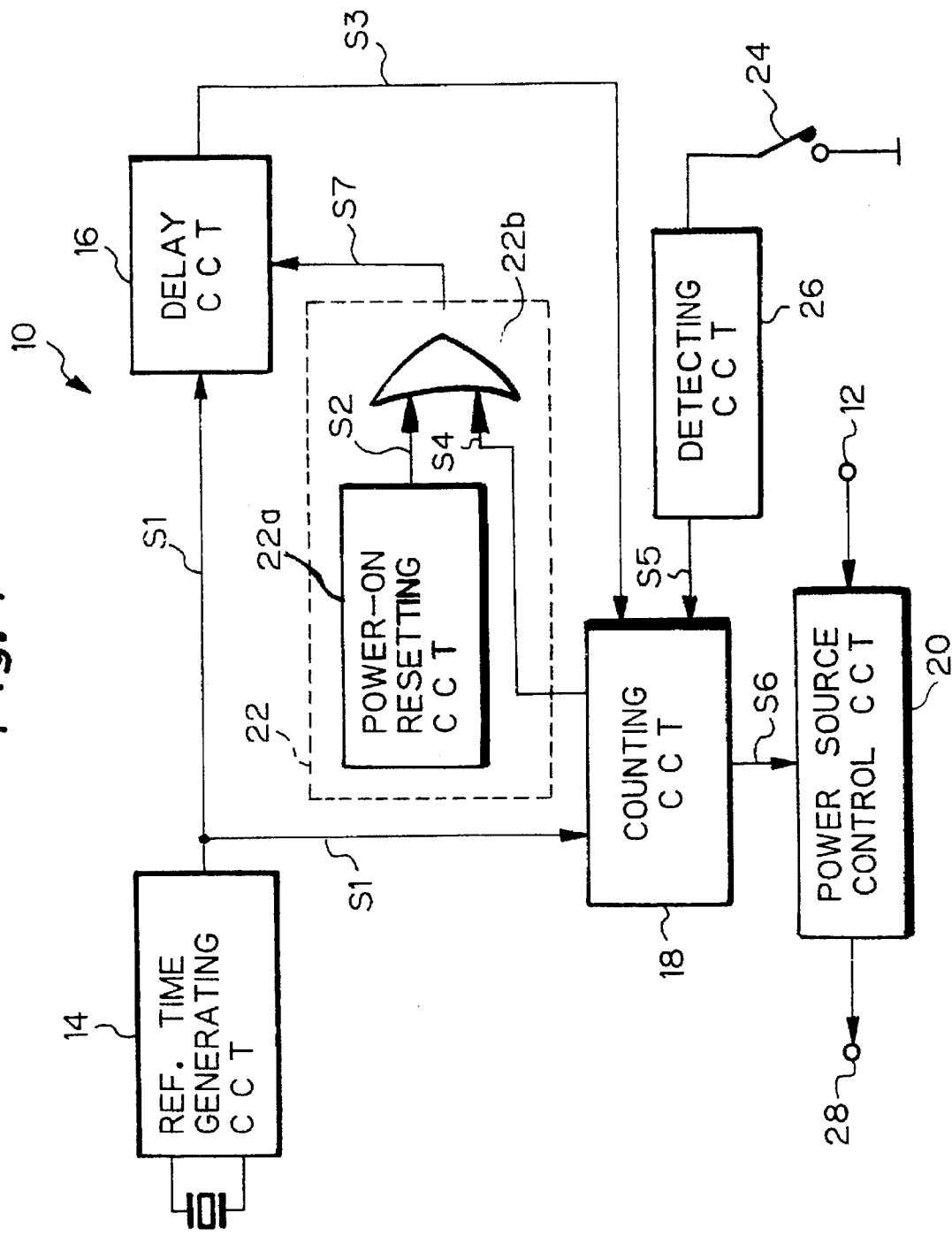
FIG. 1 is a block diagram schematically showing an essential part of a power source timer device embodying the present invention.

Referring to FIG. 1 of the drawings, a power source timer device embodying the present invention is shown. As shown, the device, generally 10, has an input terminal 12, a reference time generating circuit 14, a delay circuit 16, a counting circuit 18, a power source control circuit 20, a reset signal generating circuit 22, a power switch 24, a circuit 26 for detecting the state of the power switch 24, and an output terminal 28. The reset signal generating circuit 22 has a power-on resetting circuit 22a and an OR gate 22b.

When a voltage from a power source 30, not shown, is applied to the input terminal 12, the power source control circuit 20 controls it on the basis of an output control signal S6 from the counting circuit 18. The controlled voltage appears on the output terminal 28. In the illustrative embodiment, when the output control signal S6 is in a high level, the voltage input to the terminal 12 is output to the terminal 28. The signal S6 is generated by the combination of the reference time generating circuit 14, delay circuit 16, counting circuit 18, reset signal generating circuit 22, and power switch 24.

The reference time generating circuit 14 generates a timing clock signal S1 representative of the reference time unit of the timer device 10. The signal S1 is input to the delay circuit 16 and counting circuit 18. The delay circuit 16 counts a predetermined delay time according to the signal S1 and delivers the result to the counting circuit 18 as a control signal. This control signal serves as a switch valid signal S3 when input to the counting circuit 18. Specifically, even when the user turns on the power switch 24, the timer device 10 does not operate unless the switch valid signal S3 goes high. The delay circuit 16 is connected to the reset signal generating circuit 22. On receiving a reset signal S7 from the circuit 22, the delay circuit 16 initializes the count of the delay time.

Assume that the power-on resetting circuit 22a has generated a power-on reset signal S2, or the counting circuit 18 has generated a time over signal S4 on the elapse of a predetermined period of time for the switch valid signal S3 to appear continuously. Then, the reset signal S7 is fed from the OR gate 22b of the circuit 22 to the delay circuit 16. The detecting circuit 26 outputs a switch state signal S5 representative of the state of the power switch 24. The signal S5 goes high when the switch 24 is turned on. When the signal S5 is in a high level and after the switch valid signal S3 has remained in a high level for the above predetermined period of time, the counting circuit 18 feeds, in response to the timing clock signal S1, the time over signal S4 to the reset signal generating circuit 22 and feeds the output control signal S6 to the power source control circuit 20. In response to the signal S6, the circuit 20 controls the output of the voltage input to the terminal 12 and outputs the result of control on the terminal 28.

The operation of the embodiment will be described more specifically, taking a television (TV) game machine as an example. As shown in FIGS. 2A–2C, when the power-on reset signal S2 is generated due to power on, the delay circuit 16 plays the role of a timer such that the power switch 24 does not become valid until a predetermined delay time, e.g., twenty hours expire. On the elapse of the delay time, the switch valid signal coupled from the delay circuit 16 to the counting circuit 18 goes high. The signal S3 remains in a high level only for a predetermined period of time, e.g., one hour. While the signal S3 is in a high level, the voltage input to the terminal 12 is output to the terminal 28 every time the power switch 24 is turned on. Hence, equipment connected to the output terminal 28 can be operated, as desired.

However, on the elapse of the preselected period of time for the switch valid signal S3 to appear continuously, the counting circuit 18 feeds the time over signal S4 to the reset signal generating circuit 22. In response, the OR gate 22b of the circuit 22 delivers the reset signal S7 to the delay circuit 16 with the result that the switch valid signal S3 goes low. Thereafter, the signal S3 does not go high until the predetermined delay time, e.g., twenty hours expire.

When the power source of the timer device 10 is turned off while the timer operation is under way, the delay circuit 16 is initialized. As a result, the switch 24 is not validated until the predetermined delay time expires again.

When a TV game machine, not shown, is connected to the output terminal 28 of the timer device 10, a person cannot use it for more than one hour a day. Although the person used the machine for one hour may turn on the switch 24, the machine is not powered. If the person, irritated about such a condition, turns off the power source of the timer device 10, the period of time necessary for the switch 24 to be validated again (twenty hours) is initialized, further delaying the time when the machine can be used again.

As stated above, when the timer device 10 is built in a TV game machine, it prevents a person from playing with the machine for more than the predetermined period of time (one hour).

In summary, it will be seen that the present invention provides a power source timer device which prevents equipment incorporating it from being used illicitly or against rules. This advantage is derived from a unique arrangement which generates a long delay from the time when a power source is turned on to the time when a power source timer function is validated. When the power source is turned off and then turned on at a short interval, the device is initialized and prevents the equipment from being used over a long period of time.

Various modifications will become possible for those skilled in the art after receiving the teachings of the present disclosure without departing from the scope thereof.

What is claimed is:

1. A timer device for a power source, comprising:

an input terminal for receiving an input voltage;

a power source control circuit for controlling an output of the input voltage;

an output terminal for outputting a voltage output from said power source control circuit; and a timer circuit comprising a reference time generating circuit, a delay circuit, a counting circuit, a reset signal generating circuit, and a power switch;

wherein said reset signal generating circuit outputs a reset signal by ORing a time over signal to be output from said counting circuit on an elapse of a predetermined delay time, and a power-on reset signal to be output when said power switch is turned on, wherein said delay circuit counts said predetermined delay time on the basis of a timing clock signal output from said reference time generating circuit, initializes a count of said predetermined delay time in response to said reset signal, and feeds a switch valid signal to said counting circuit, wherein said counting circuit receives said timing clock signal, a signal representative of a state of said power switch, and said control signal, and outputs said time over signal to said reset signal generating circuit while outputting a power source output control signal to said power source output control circuit, and wherein said power source control circuit controls the output of the voltage on the basis of said power source output control signal, and outputs a result of control on said output terminal.

2. A timer device as claimed in claim 1, wherein said reset signal generating circuit comprises:

a power-on reset circuit for outputting a power-on reset signal when said power switch is turned on; and an OR gate for receiving said time over signal and said power-on reset signal.

3. A timer device for controlling power, comprising:

an input terminal for receiving an input voltage;

an output terminal for outputting an output voltage;

a timer for generating a delay time measured from a time when said input terminal initially receives said input voltage to a time when said timer receives a delay circuit reset signal;

said timer including:

a reference time generating circuit for outputting a reference timing clock signal;

a delay circuit for counting said delay time based on said reference timing clock signal, and for outputting a switch valid signal;

a detecting circuit for detecting a state of a power switch operable to receive said input voltage, and for outputting a signal representative of said state;

a counting circuit for outputting, when said signal from said detecting circuit is representative of an ON state and when said switch valid signal is in a high level, a time-over signal indicative of an elapse of a predetermined period of time based on said timing clock signal, and for outputting a power source output control signal; and a power source control circuit for outputting, to said output terminal, a voltage applied to said input terminal, in response to said power source output control signal;

said delay circuit being reset when said input terminal stops receiving said input voltage and after an interval, again receives said input voltage.

4. A timer device as claimed in claim 3, wherein said timer further comprises a reset signal generating circuit including:

a power-on reset circuit for outputting a power-on reset signal when said power switch is turned on; and an OR gate for receiving said time-over signal and said power-on reset signal, and for feeding said delay circuit reset signal to said delay circuit when said time-over signal or said power-on reset signal is output.

* * * * *